United States Patent
Murata

[19]

[11] Patent Number: 6,133,585
[45] Date of Patent: Oct. 17, 2000

[54] SEMICONDUCTOR DEVICE

[75] Inventor: Naofumi Murata, Tokyo, Japan

[73] Assignee: Mitsubishi Denki Kabushiki Kaisha, Tokyo, Japan

[21] Appl. No.: 09/349,515

[22] Filed: Jul. 9, 1999

[30] Foreign Application Priority Data

Jan. 18, 1999 [JP] Japan ................................ 11-009340

[51] Int. Cl.[7] .................. H01L 29/04; H01L 31/036; H01L 31/0376; H01L 31/20
[52] U.S. Cl. ...................... 257/59; 257/72; 257/290; 257/291; 257/294
[58] Field of Search .............................. 257/401, 59, 72, 257/290, 291, 797, 294

[56] References Cited

U.S. PATENT DOCUMENTS 5,990,567  11/1999  Tseng et al. ........................ 257/797

FOREIGN PATENT DOCUMENTS 3-20080  1/1991  Japan .
7-99230  4/1995  Japan .
8-46166  2/1996  Japan .

*Primary Examiner*—Tom Thomas
*Assistant Examiner*—Thien F Tran
*Attorney, Agent, or Firm*—Oblon, Spivak, McClelland, Maier & Neustadt, P.C.

[57] ABSTRACT

There is provided a semiconductor device which can readily detect a desired position. The semiconductor device comprises a semiconductor substrate (12) and a plurality of pixels (2) which are identical in appearance on the semiconductor substrate (12). Of the pixels (2), pixels (2) selected by a predetermined rule are provided with mark patterns (4) and the remaining pixels are provided with no mark pattern.

1 Claim, 10 Drawing Sheets

BACKGROUND ART

BACKGROUND ART

SEMICONDUCTOR DEVICE

BACKGROUND OF THE INVENTION

1. Field of the Invention

The present invention relates to a semiconductor device such as an area image sensor (solid-state image sensor) and a large-scale TEG (Test Element Group).

2. Description of the Background Art

FIG. 17 is a conceptual rendering of a conventional semiconductor device (area image sensor), showing a pixel area 1*a* and part of the area 1*a* enlarged. The pixel area 1*a* is formed from a matrix of many pixel patterns 2*a*.

With recent downsizing of semiconductor devices, the number of pixel patterns 2*a* in the semiconductor device is greatly increasing to hundreds of thousands to millions. On one side of the pixel area 1*a*, thousands of pixel patterns 2*a* are lined. Since the positions of those pixel patterns 2*a* are directly reflected in images, unlike a memory device that is divided into several memory areas, the pixel patterns 2*a* must be equally spaced in the pixel area 1*a*. Accordingly, even if defectiveness due to point or line defects is found in the vicinity of the center of the pixel area 1*a* by electric characteristic or image evaluation of the pixel area 1*a*, it is extremely difficult to detect a position of a defect 5*a* in analysis of the cause of defectiveness.

The same goes for the large-scale TEG. Since uniform wiring patterns 2*b* are formed in a region 1*b* of the TEG, as shown in FIG. 18, even if defectiveness is found by the electric characteristic evaluation and a defect 5*b* is found in the region 1*b* by using a failure locating technique, it is extremely difficult to detect a position of the defect 5*b* in analysis of the cause of defectiveness.

SUMMARY OF THE INVENTION

A first aspect of the present invention is directed to a semiconductor device comprising: a semiconductor substrate; and a plurality of patterns which are identical in appearance on the semiconductor substrate, wherein in a region composed of the plurality of patterns, portions that are selected by a predetermined rule are provided with mark patterns and the remaining portions are provided with no mark pattern.

A second aspect of the present invention is directed to a semiconductor device comprising: a semiconductor substrate; and a plurality of patterns which are identical in appearance on the semiconductor substrate, wherein each of the plurality of patterns includes a member having the same function; and wherein the members in patterns that are selected out of the plurality of patterns by a predetermined rule differ in shape from those in the remaining patterns.

A third aspect of the present invention is directed to a semiconductor device comprising: a semiconductor substrate; and a plurality of patterns which are identical in appearance on the semiconductor substrate, wherein a region composed of the plurality of patterns is provided with a matrix of mark lines.

According to a fourth aspect of the present invention, in the semiconductor device of the first aspect, the plurality of patterns are elements each converting lights into an electric signal.

According to a fifth aspect of the present invention, in the semiconductor device of the first aspect, the plurality of patterns are elements each converting lights into an electric signal; the portions selected by the predetermined rule include the elements; and the elements in the portions selected by the predetermined rule are surrounded by the mark patterns.

According to a sixth aspect of the present invention, in the semiconductor device of the first aspect, the plurality of patterns are wires. The semiconductor device is designed specifically for evaluation of the wires.

According to a seventh aspect of the present invention, in the semiconductor device of the first aspect, the plurality of patterns are wires; and the mark patterns in the portions selected by the predetermined rule are bent portions of the wires. The semiconductor device is designed specifically for evaluation of the wires.

According to an eighth aspect of the present invention, in the semiconductor device of the second aspect, the plurality of patterns are elements each converting lights into an electric signal.

According to a ninth aspect of the present invention, in the semiconductor device of the third aspect, the plurality of patterns are elements each converting lights into an electric signal.

According to a tenth aspect of the present invention, in the semiconductor device of the second aspect, the plurality of patterns are wires. The semiconductor device is designed specifically for evaluation of the wires.

According to an eleventh aspect of the present invention, in the semiconductor device of the third aspect, the plurality of patterns are wires. The semiconductor device is designed specifically for evaluation of the wires.

In accordance with the first aspect, a desired position is readily detectable with the mark patterns arranged regularly.

In accordance with the second aspect, a desired position is readily detectable with a regular difference in the shapes of the members.

In accordance with the third aspect, a desired position is readily detectable with the matrix of mark lines.

In accordance with the fourth aspect, the semiconductor device (for example, the area image sensor) effectively detects a desired position.

In accordance with the fifth aspect, when a mark pattern is provided only between adjacent elements, it is unclear which of the adjacent elements the mark pattern belongs to. However, by surrounding that element with the mark patterns, the element selected by the predetermined rule can be clearly specified. Accordingly, the semiconductor device (for example, the area image sensor) effectively detects a desired position.

In accordance with the sixth aspect, the semiconductor device designed specifically for evaluation of wires effectively detects a desired position.

In accordance with the seventh aspect, the semiconductor device designed specifically for evaluation of wires effectively detects a desired position with the wires that are bent according to the predetermined rule .

In accordance with the eighth and ninth aspects, the semiconductor device (for example, the area image sensor) effectively detects a desired position.

In accordance with the tenth and eleventh aspects, the semiconductor device designed specifically for evaluation of wires effectively detects a desired position.

An object of the present invention is therefore to provide a semiconductor device which can readily detect a desired position.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Preferred Embodiment

Figure 1:
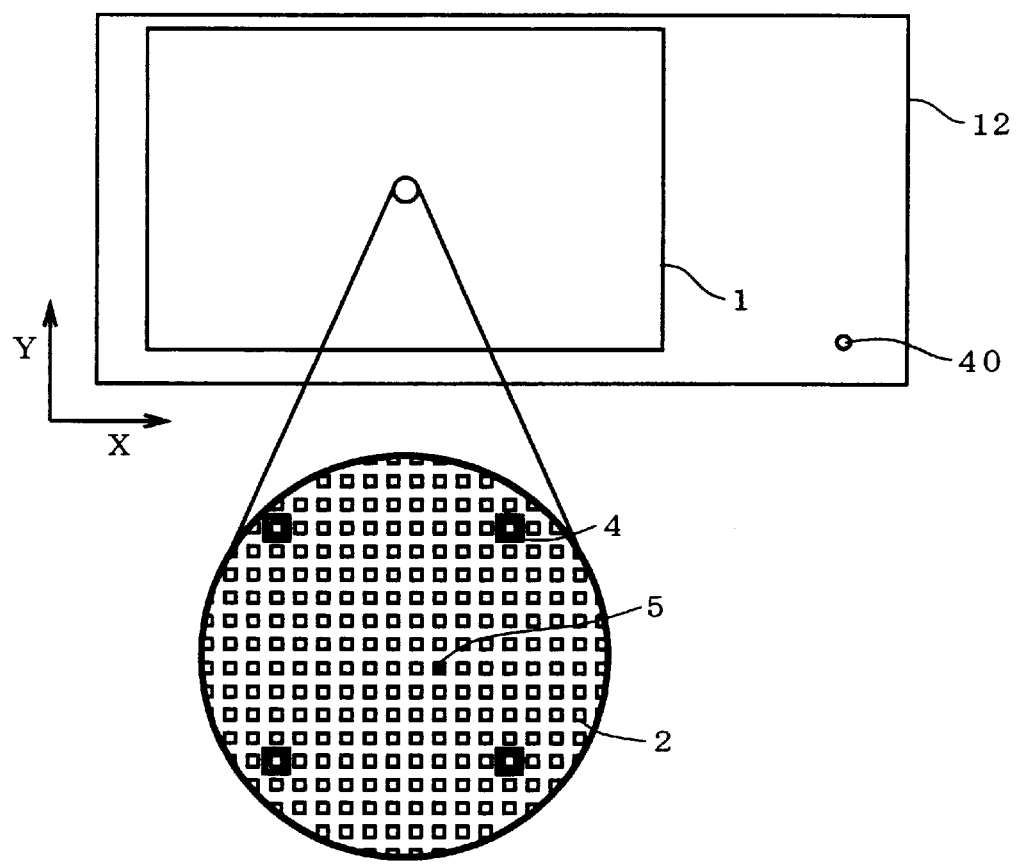
FIGS. 1 and 2 conceptual renderings of a semiconductor device according to a first preferred embodiment of the present invention.

FIG. 1 is a conceptual rendering of a semiconductor device according to a first preferred embodiment, showing part of the device enlarged. The semiconductor device of FIG. 1 is, for example, an area image sensor such as a CCD.

The area image sensor is provided with a light-sensitive pixel area 1 formed on a semiconductor substrate 12. The pixel area 1 is formed from a matrix of many pixel patterns 2 which are identical in appearance. The number of pixel patterns 2 rises to hundreds of thousands to millions, and on one side of the pixel area 1, thousands of pixel patterns 2 are lined. Since the positions of those pixel patterns 2 are directly reflected in images, the pixel patterns 2 are equally spaced in the pixel area 1.

The pixel patterns (portions) 2 which are selected by a predetermined rule are provided with mark patterns 4. For instance, the mark patterns 4 are provided at intervals of ten pixel patterns 2 as shown in FIG. 1.

Figure 2:
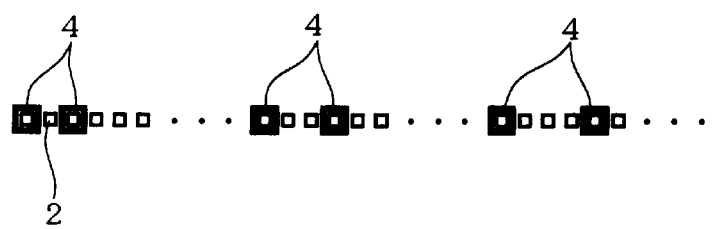

Alternatively, the mark patterns 4 may be provided according to such a rule as shown in FIG. 2. That is, sets of two mark patterns 4 are placed in such a manner that the intervals between two mark patterns 4 in each set are lengthened by one pixel pattern 2 at a time (for example, one pixel pattern 2, two pixel patterns 2, three pixel patterns 2, . . . ). The rule that a plurality of patterns make a set is also applicable to the other preferred embodiments of the present invention which will be described later.

Figure 3:
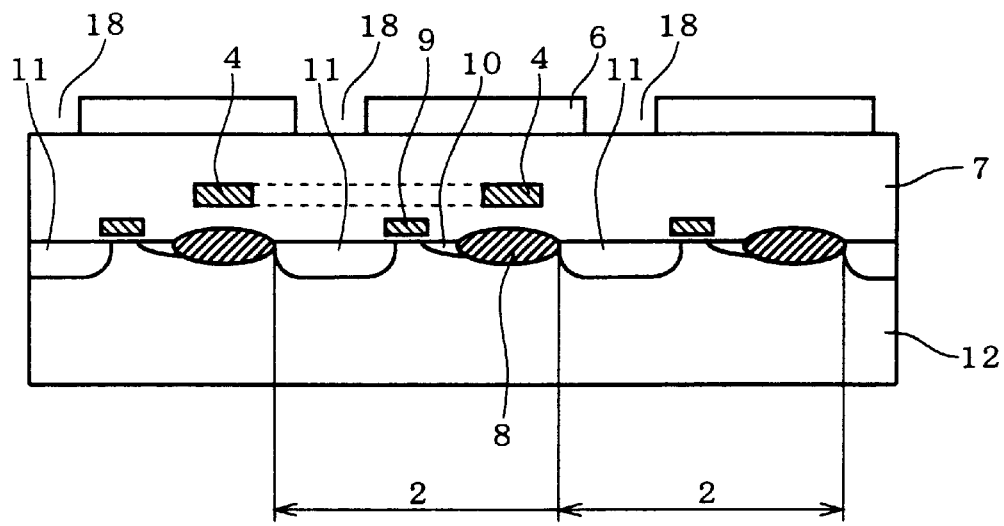
FIG. 3 is a cross-sectional view showing part of the semiconductor device of the first preferred embodiment.

FIG. 3 is a cross-sectional view taken along a direction X, showing part of the pixel area 1 in the semiconductor device of FIG. 1. The surface of the semiconductor substrate 12 is divided in a matrix by element isolation regions 8. Each region divided by the element isolation regions 8 includes a gate electrode 9, an impurity diffusion region (source/drain) 10, and a photodiode 11. The pixel pattern 2 is mainly composed of the gate electrode 9, the impurity diffusion region 10, the photodiode 11, wiring (not shown), and a light shielding film 6.

An interlayer film 7 covers the element isolation region 8, the gate electrode 9, the impurity diffusion region 10, and the photodiode 11. The light shielding film 6 covers the interlayer film 7, but openings 18 are formed above the photodiodes 11.

Turning now briefly to the operation of the pixel pattern 2, the photodiodes 11 are irradiated with lights from above the area image sensor through the openings 18 and the interlayer film 7, although part of the lights is shut off by the light shielding film 6. Light irradiation of the photodiodes 11 causes accumulation of electrons. That is, the photodiodes 11 are electrons each converting lights into an electric signal. When a voltage is applied to the gate electrode 9, the electrons accumulated on the photodiodes 11 migrate to the impurity diffusion region 10 from which they are outputted as an electric signal to the outside.

As to the formation of the mark patterns 4, the mark patterns 4 are provided in a layer of the semiconductor substrate 12 where a pattern 40 (e.g., wiring pattern of FIG. 1) other than the pixel area 1 is formed. Since the pattern 40 and the mark patterns 4 are formed in the same layer, there is no need to add a reticle which is used in the formation of layers. Alternatively, the mark patterns 4 may be formed in a newly added layer of polysilicon, for example.

Here the mark patterns 4 are formed in an empty space in the pixel pattern 2 outside the photodiodes 11 so that they hardly affects the light irradiation of the photodiodes 11. Especially, in FIG. 3, the mark patterns 4 are formed to surround the photodiodes 11.

Next, with respect to the effect of the first preferred embodiment, consider the case where defectiveness due to point or line defects is found in the vicinity of the center of the pixel area 1 by electric characteristic or image evaluation of the area image sensor and the cause of defectiveness is analyzed. In order to analyze the cause of defectiveness, the position of a defect is searched by an optical or electron microscope after removal of the light shielding film 6. FIG. 1 shows such a defect 5. Since only the pixel patterns 2 selected by a predetermined rule as shown in FIGS. 1 and 2 are provided with the mark patterns 4 and the remaining pixels 2 are provided with no mark pattern 4, the position of the defect 5 is readily detectable. For instance, when the defect 5 is in the 1520th pixel pattern 2 from the edge of the pixel area 1, it has been a conventional practice to count 1520 pixel patterns. In the first preferred embodiment, on the other hand, when the mark patterns 4 are provided at intervals of 100 pixel patterns 2, the position of the defect 5 can be detected only by counting 15 mark patterns 4 and 20 pixel patterns 2. In addition, such a configuration as shown in FIG. 2 heightens this effect.

2. Second Preferred Embodiment

Figure 4:
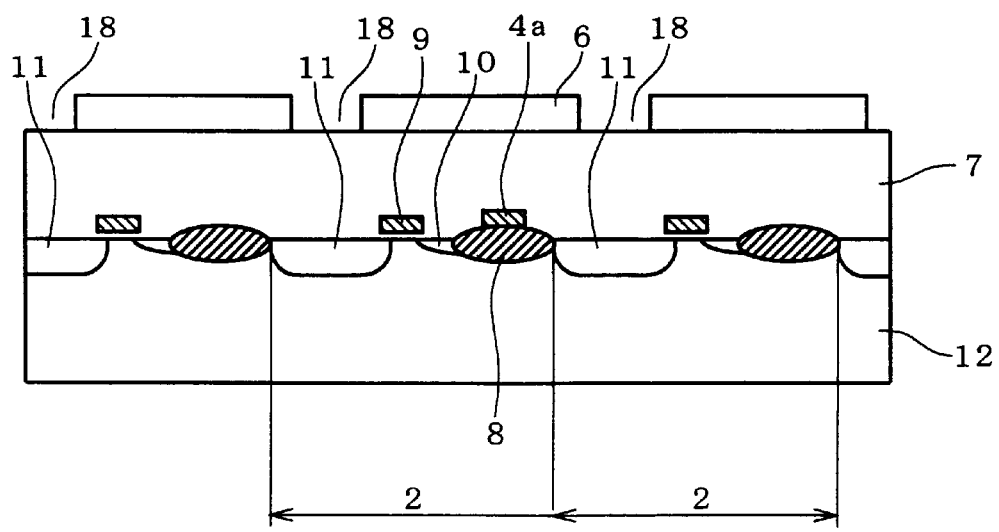
FIG. 4 is a cross-sectional view showing part of a semiconductor device according to a second preferred embodiment of the present invention.

FIG. 4 is a cross-sectional view showing part of a semiconductor device according to a second preferred embodiment of the present invention, e.g., part of the image area 1 of the semiconductor device of FIG. 1 taken along the direction X. The second preferred embodiment is characterized in that the mark patterns 4 of FIG. 1 are substituted with mark patterns (extra pattern) 4a.

In the first preferred embodiment, the mark patterns 4 are formed in the layer where the pattern 40 other than the image area 1 is formed, or in a newly added layer. In this second preferred embodiment, on the other hand, the mark patterns 4a are added in a layer of the image area 1 where the gate electrode 9 and wiring (wire 13 of FIG. 5 which will be described later) are formed. Since the gate electrode 9, the wiring, and the mark patterns 4a are formed in the same layer, there is no need to add a reticle which is used in the formation of layers.

The mark patterns 4a are, as in the first preferred embodiment, provided in an empty space in the pixel patterns 2 so that they hardly affect the light irradiation of the photodiodes 11.

In addition, the mark patterns 4a are formed in the pixel patterns 2 which are selected by a predetermined rule described with FIGS. 1 and 2. The position of a defect is thus readily detectable as in the first preferred embodiment.

3. Third Preferred Embodiment

Figure 5:
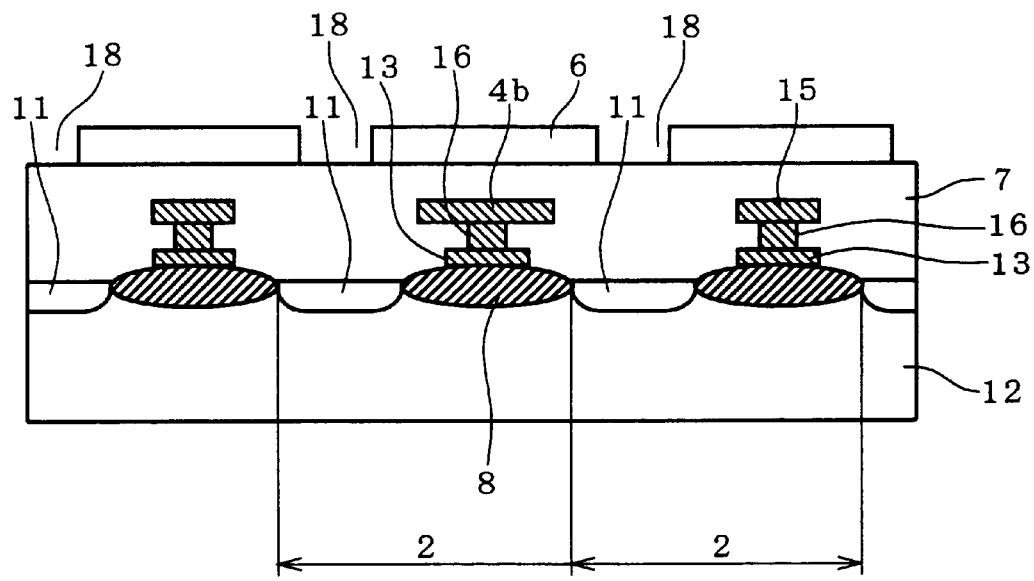
FIGS. 5 and 6 are cross-sectional views showing part of a semiconductor device according to a third preferred embodiment of the present invention.

FIG. 5 is a cross-sectional view showing part of a semiconductor device according to a third preferred embodiment, e.g., part of the image area 1 in the semiconductor device of FIG. 1 taken along a direction Y. The third preferred embodiment is characterized in that the shape of the wiring is altered instead of providing the mark patterns 4 of FIG. 1.

Each pixel pattern 2 of FIG. 3 includes a wire 13 (or contact area of the gate electrode), a contact hole 16, and a wire 15 or 4b in addition to the gate electrode 9, the impurity diffusion region 10, and the photodiode 11. The wire 13 is formed on the element isolation region 8; the contact hole 16 is formed on the wire 13; and the wire 15, 4b is formed on the contact hole 16, forming wiring for connecting the pixel pattern 2 to an external circuit (not shown), or wiring for connecting elements in the pixel pattern 2.

Both the wires (members) 15, 4b have the same function. The wire 4b is obtained by altering the shape of the wire 15 in the pixel pattern 2 which is selected by a predetermined rule as described with FIGS. 1 and 2.

Figure 6:
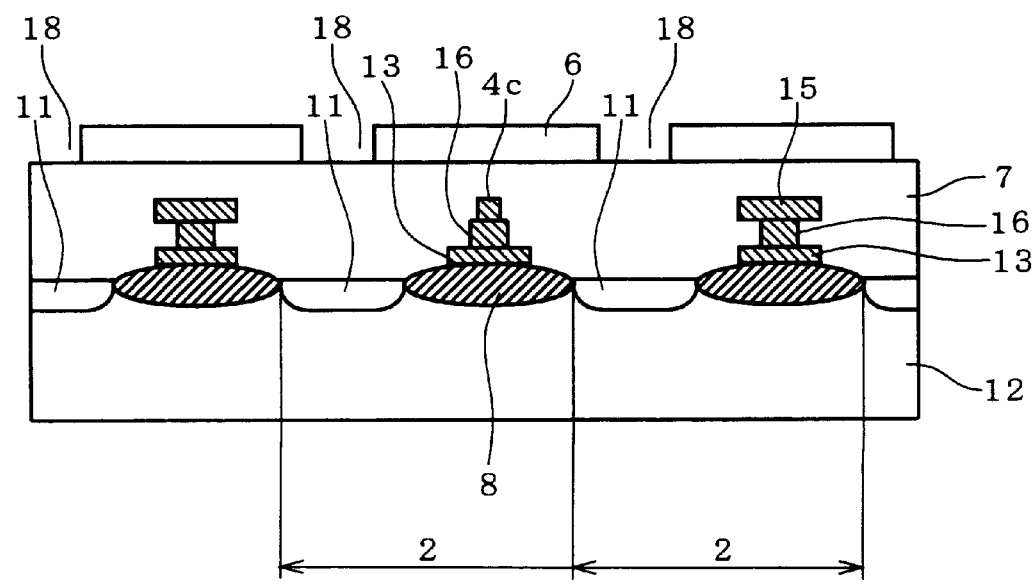

In FIG. 5, the wire 4b is larger in size than the wire 15, but it may be smaller than the wire 15 like a wire 4c (member) shown in FIG. 6.

With the wire 4b, 4c, the position of a defect is readily detectable as in the first preferred embodiment.

4. Fourth Preferred Embodiment

Figure 7:
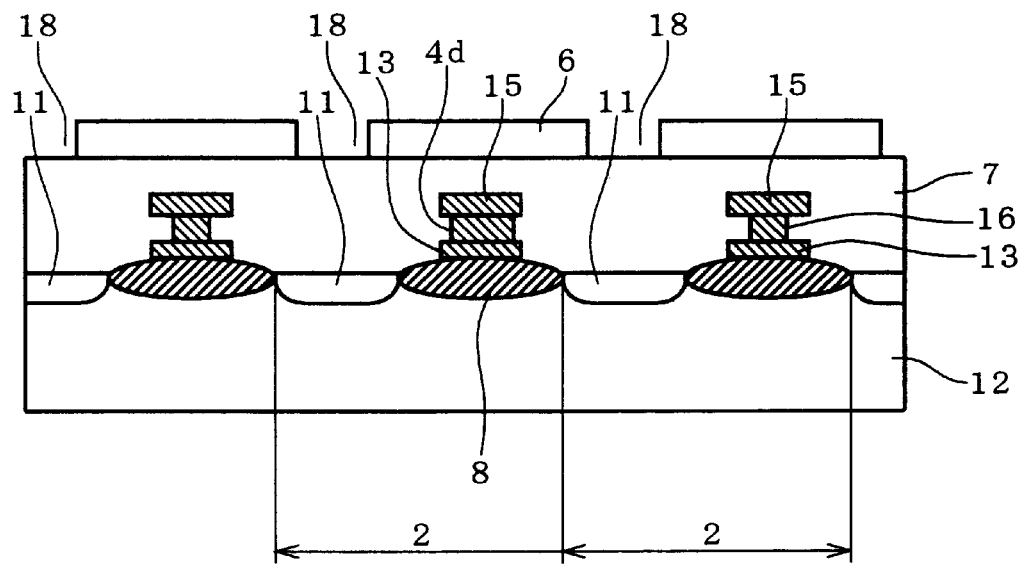
FIG. 7 is a cross-sectional view showing part of a semiconductor device according to a fourth preferred embodiment of the present invention.

FIG. 7 is a cross-sectional view showing part of a semiconductor device according to a fourth preferred embodiment of the present invention, e.g., part of the image area 1 in the semiconductor device of FIG. 1 taken along the direction Y. The fourth preferred embodiment is characterized in that the shape of the contact holes 16 in the pixel patterns 2 are altered instead of providing the mark patterns 4 of FIG. 1.

In the third preferred embodiment, out of the wires 13, 15 and the contact hole 16, the wire 15 is altered in shape to obtain the wire 4b, 4c. In this fourth preferred embodiment, on the other hand, the shape of the contact holes 16 is altered to obtain a contact hole 4d. Different only in shape, the contact hole (member) 4d has the same function as the contact hole (member) 16.

In FIG. 7, the contact hole 4d is larger in size than the contact hole 16, but it may be smaller than the contact hole 16. The remaining structure is identical to that of the third preferred embodiment. Alternatively, when the pixel pattern 2 is provided with a via hole (member) for establishing continuity between upper and lower wires of multilayer interconnections, the shape of the via hole may be altered instead of the contact hole.

With the contact hole 4d, the position of a defect is readily detectable as in the first preferred embodiment.

5. Fifth Preferred Embodiment

Figure 8:
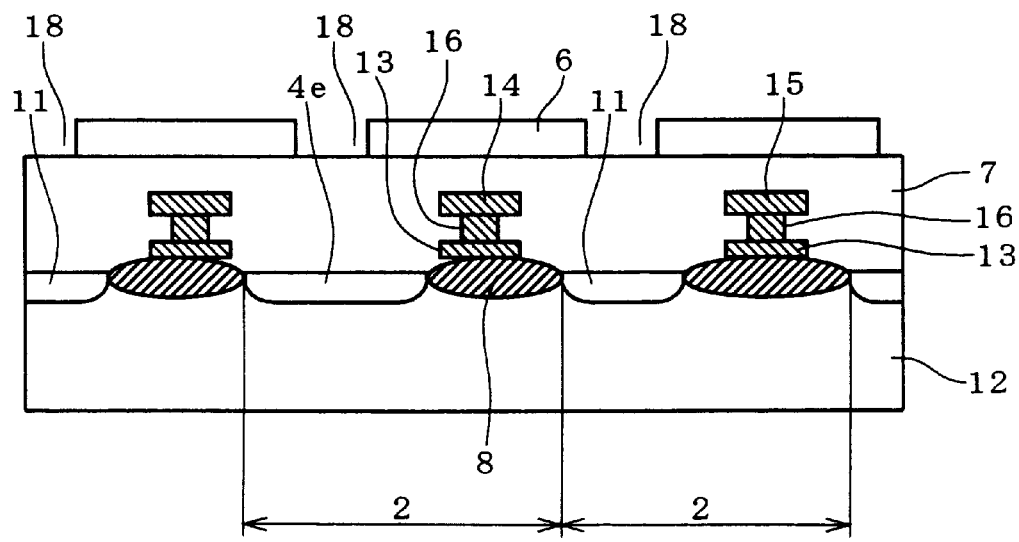
FIG. 8 is a cross-sectional view showing part of a semiconductor device according to a fifth preferred embodiment of the present invention.

FIG. 8 is a cross-sectional view showing part of a semiconductor device according to a fifth preferred embodiment, e.g., part of the image area 1 in the semiconductor device of FIG. 1 taken along the direction Y. The fifth preferred embodiment is characterized in that the shape of the photodiodes 11 is altered instead of providing the mark patterns 4 of FIG. 1.

In the fifth preferred embodiment, the shape of the photodiode 11 is altered to obtain a photodiode 4e. Different only in shape, the photodiode 4e (member) has the same function as the photodiode (member) 11.

In FIG. 8, the photodiode 4e is larger in size than the photodiode 11, but it may be smaller than the photodiode 11. The remaining structure is identical to that of the third preferred embodiment.

The modification of the photodiode 11 changes the output value of the pixel pattern 2, so that a signal read out from the pixel pattern 2 needs to be modified.

With the photodiode 4e, the position of a defect is readily detectable as in the first preferred embodiment.

6. Sixth Preferred Embodiment

Figure 9:
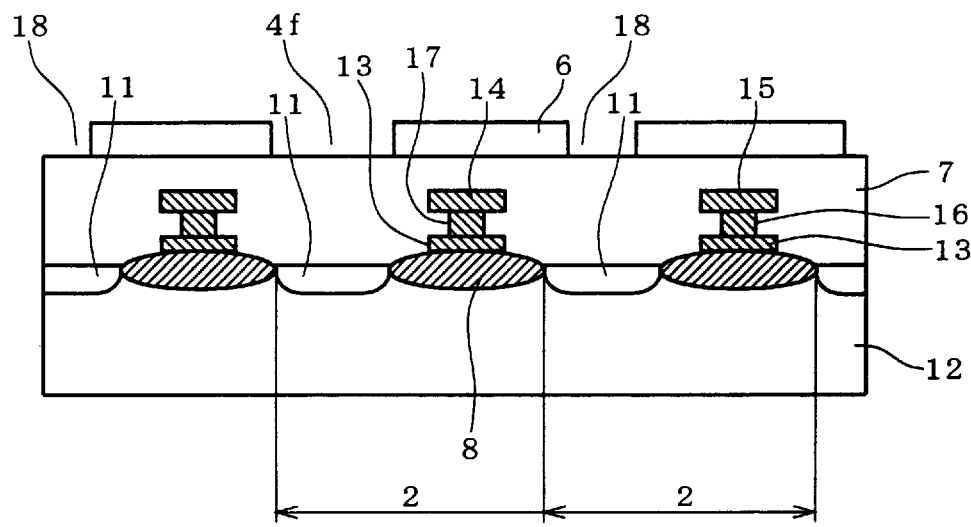
FIG. 9 is a cross-sectional view showing part of a semiconductor device according to a sixth preferred embodiment of the present invention.

FIG. 9 is a cross-sectional view showing part of a semiconductor device according to a sixth preferred embodiment of the present invention, e.g., part of the image area 1 in the semiconductor device of FIG. 1 taken along the direction Y. The sixth preferred embodiment is characterized in that the shape of the light shielding film 6 is altered to alter the shape of the openings 18 instead of providing the mark patterns 4 of FIG. 1.

In the sixth preferred embodiment, the shape of the opening 18 is altered to obtain an opening 4f. Different only in shape, the opening (member) 4f has the same function as the opening (member) 18.

In FIG. 9, the opening 4f is larger in size than the opening 18, but it may be smaller than the opening 18. The remaining structure is identical to that of the third preferred embodiment.

The modification of the openings 18 changes the output value of the pixel patterns, so that a signal read out from the pixel pattern 2 needs to be modified.

With the opening 4f, the position of a defect is readily detectable as in the first preferred embodiment.

7. Seventh Preferred Embodiment.

Figure 10:
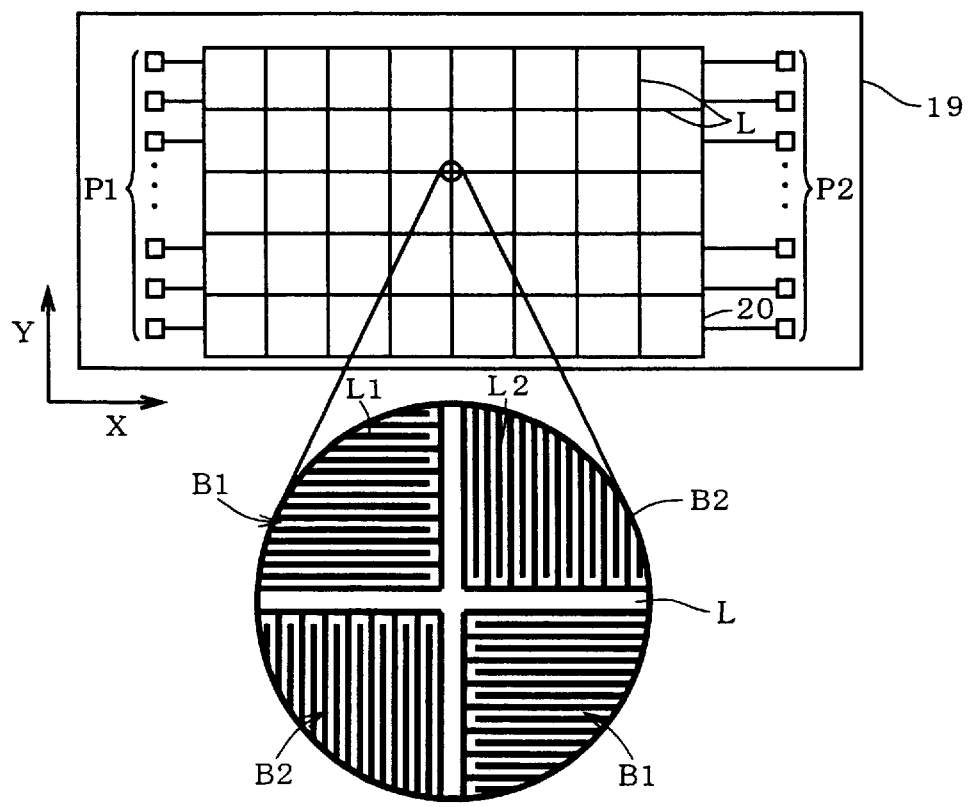
FIG. 10 is a cross-sectional view showing part of a semiconductor device according to a seventh preferred embodiment of the present invention.

FIG. 10 is a conceptual rendering of a semiconductor device according to a seventh preferred embodiment, showing part of the device enlarged. The semiconductor device of FIG. 10 is a TEG designed specifically for wiring evaluation.

In the TEG, a TEG region 20 with objects to be evaluated is formed on a semiconductor substrate 19. On the semiconductor substrate 19, a plurality of pads P1, P2 are formed in a row. The pads P1 and P2 are connected to the TEG region 20.

The TEG region 20 is provided with a matrix of mark lines L that divide the TEG region 20 into a plurality of blocks. The mark lines L, however, exert no electric influence on the objects to be evaluated.

Referring to part of the TEG region 20 enlarged, the mark line L is a space between blocks B1 and B2. The block B1 is a group of lines L1 which are identical in appearance in parallel with each other in the direction X; and the block B2 is a group of lines L2 which are identical in appearance in parallel with each other in the direction Y. Each line L1, L2 is an object to be evaluated. The TEG region 20 comprises alternating blocks B1 and B2.

The wires L1 and L2 are each connected to either pad P1 or P2. For instance, the block B1 is surrounded by spaces, or the mark line L1, but connected to either pad P1 or P2 via a wire not shown.

As an alternative to the configuration of FIG. 1, the number of pads P1 and P2 may be reduced to two to connect the plurality of blocks in the TEG region 20 in sequence with wires not shown.

In this fashion, the presence of the mark lines L in the TEG region makes the spacing between the blocks B1 and B2 clear, so that the position of a defect is readily detectable. In addition, a difference in direction between the wires L1 of the block B1 and the wires L2 of the block B2 further facilitates the detection of a defect.

8. Eighth Preferred Embodiment

Figure 11:
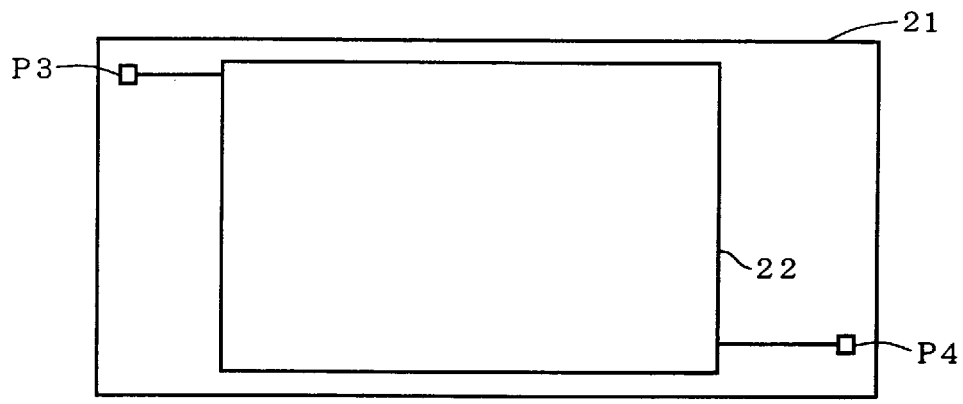
FIG. 11 is a conceptual rendering of a semiconductor device according to eighth through eleventh preferred embodiments of the present invention.

FIG. 11 is a plan view showing the concept of semiconductor devices according to eighth through eleventh preferred embodiments. The semiconductor device of FIG. 11 is a TEG for evaluating isolation of wires, contact holes, or via holes. In the TEG, a TEG region 22 with objects to be evaluated is formed on a semiconductor substrate 21 and pads P3 and P4 are formed on the semiconductor substrate 21. The pads P3 and P4 are connected to the TEG region 22.

Figure 12:
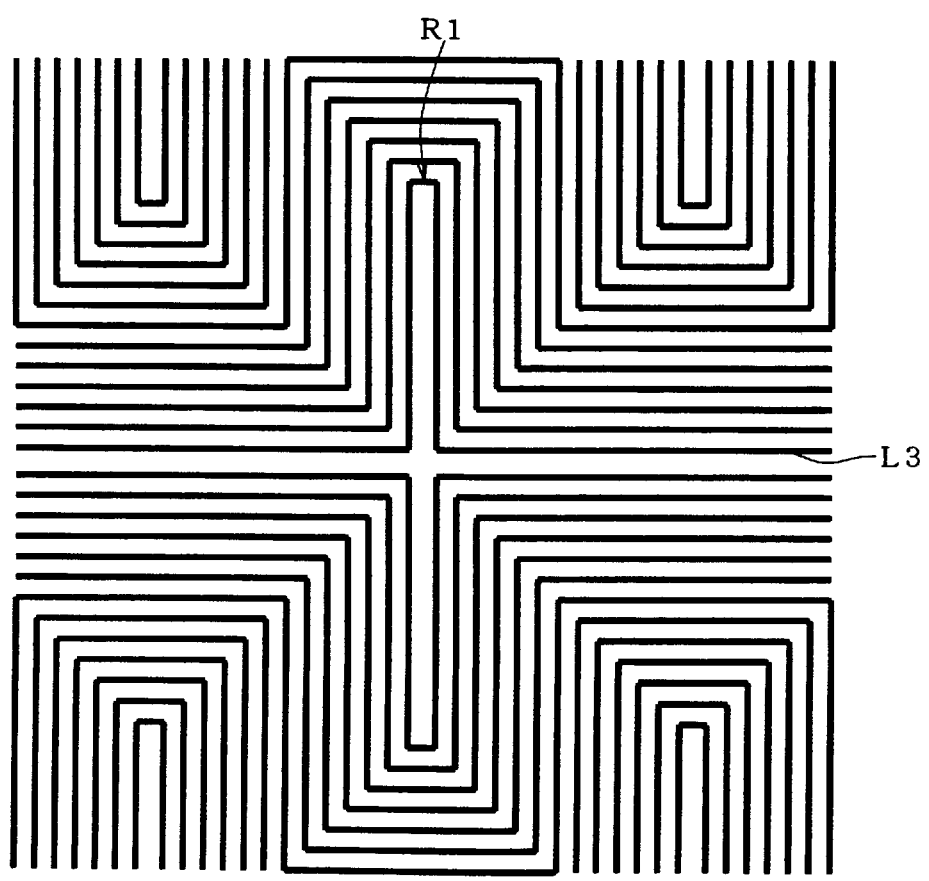
FIGS. 12 and 13 are plan views showing part of the semiconductor device of the eighth preferred embodiment.

FIG. 12 is a plan view showing part of the semiconductor device according to the eighth preferred embodiment, e.g., the TEG region 22 of FIG. 11 enlarged.

On the TEG region 22, wires L3 to be evaluated are formed in parallel with each other. Each wire L3 is connected at its one end to the pad P3 and at its other end to the pad P4. The wire L3 may be a multilayer interconnection chain pattern.

Figure 13:
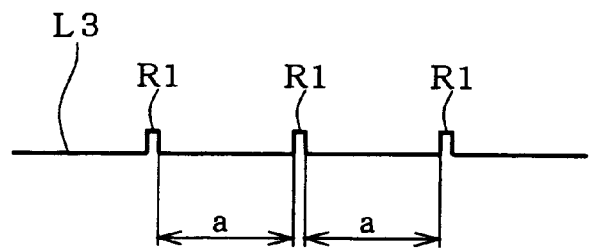

Part of the wire L3 is shown in FIG. 13. The wire 13 has a plurality of bent portions (mark patterns) Ri. The bent portions R1 are provided at predetermined intervals on the wire L3. For instance, they may be formed at regular intervals of a as shown in FIG. 13 or at different intervals which vary according to a certain rule, e.g., 1:2:3 .... The rule for the bet portions R1 is not limited to the intervals between adjacent bent portions R1. For instance, the central one bent portion R1 may be substituted with two bent portions R1, and the right one bent portion R1 with three bent portions R1 so that the number of bent portions R1 in each set be increased, for example, 1, 2, 3, ... from left to right.

With respect to the effect of the eighth preferred embodiment, a TEG designed specifically for wiring evaluation only has to evaluate short or open of the wiring. The conventional device was designed with emphasis only on long wiring, so that no consideration was given to the detection of a defect. In the present invention, on the other hand, the position of a defect is readily detectable with the wires L3 having bent portions provided by a predetermined rule.

9. Ninth Preferred Embodiment

Figure 14:
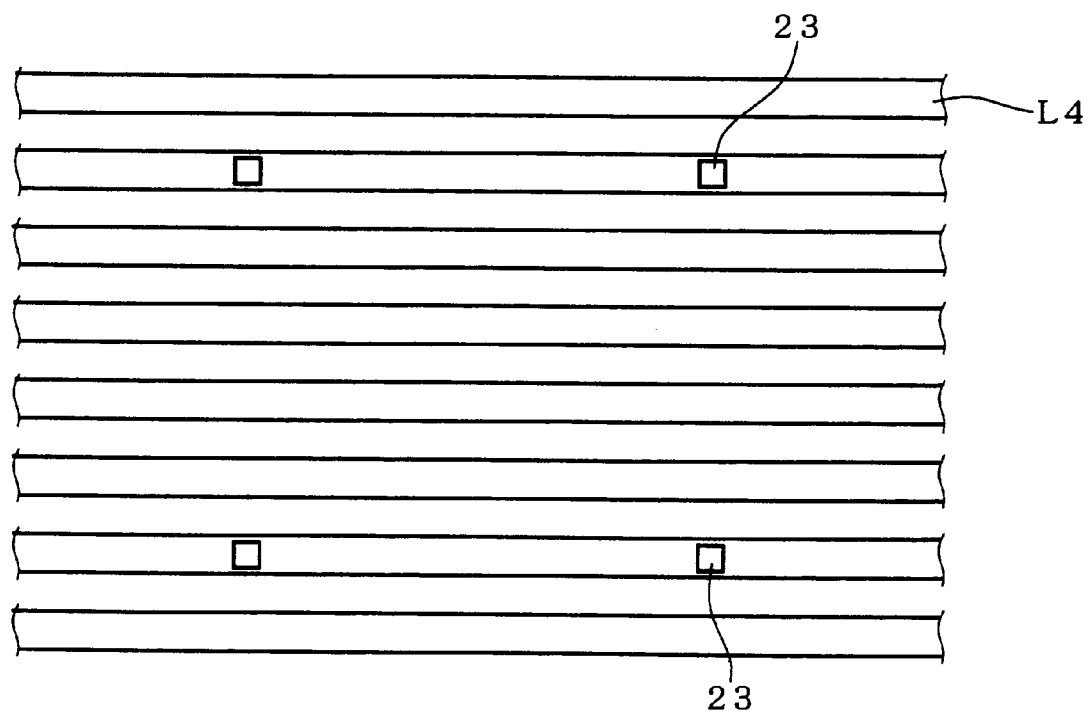
FIG. 14 is a plan view showing part of the semiconductor device of the ninth preferred embodiment.

FIG. 14 is a plan view showing part of the semiconductor device (TEG) according to the ninth preferred embodiment, e.g., the TEG region 22 of FIG. 11 enlarged. The TEG of the ninth preferred embodiment is designed to evaluate short or open of the wiring.

On the TEG region 22, wires LA to be evaluated are formed in parallel with each other. That is, the parallel wires L4 are identical in appearance. Each wire L4 is connected at its one end to the pad P3 and at its other end to the pad P4.

The wires L4 which are selected by a predetermined rule are provided with dummy mark via hole patterns 23. For instance, the mark via hole patterns 23 are provided at intervals of ten parallel wires L4 as shown in FIG. 14. The mark via hole patterns 23 may be substituted with dummy mark contact hole patterns.

In this fashion, the mark via hole patterns 23 are provided only on the wires (portions) selected out of all the parallel wires by a predetermined rule. The position of a defect is thus readily detectable as in the first preferred embodiment.

10. Tenth Preferred Embodiment

Figure 15:
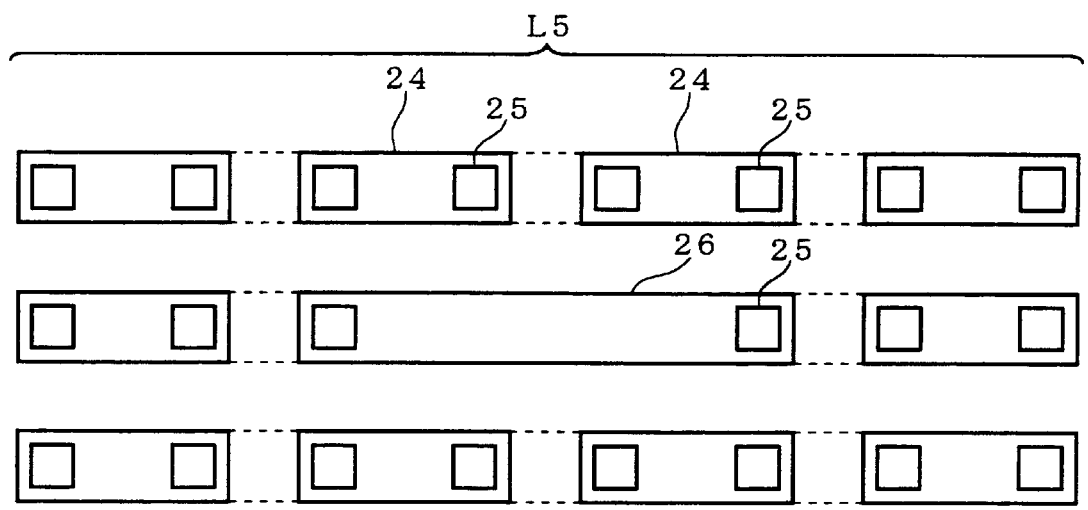
FIG. 15 is a plan view showing part of the semiconductor device of the tenth preferred embodiment.

FIG. 15 is a plan view showing part of the semiconductor device according to the tenth preferred embodiment, e.g., the TEG region 22 of FIG. 11 enlarged. The TEG of the tenth preferred embodiment is designed to evaluate short or open of the wiring, especially to evaluate via holes.

On the TEG region 22, wires L5 to be evaluated are formed in parallel with each other. The wires 15 have multilayer interconnection configuration. In FIG. 15, upper wiring patterns 24 are indicated by the solid line; and lower wiring patterns by the broken line. The upper wiring patterns 24 and the lower wiring patterns are electrically connected to each other through via holes 25. That is, the wiring patterns 24 and the via holes 25 are identical in appearance. Each wire 5 is connected at its one end to the pad P3 and at its other end to the pad P4.

Further, the shape of wiring patterns 24 which are selected by a predetermined rule is altered to obtain wiring patterns 26. Here the predetermined rule is for example to select one for every 10 wiring patterns 24 to alter the shape of the wiring patterns 24.

The wiring pattern (member) 26 is formed in the same layer as the wiring pattern (member) 24, so that it has the same function of establishing continuity between the pads P3 and P4 as the wiring pattern 24. In FIG. 15, the wiring pattern 26 is obtained by connecting the adjacent wiring patterns 24.

With the wiring patterns 26, the position of a defect is readily detectable as in the first preferred embodiment.

11. Eleventh Preferred Embodiment

Figure 16:
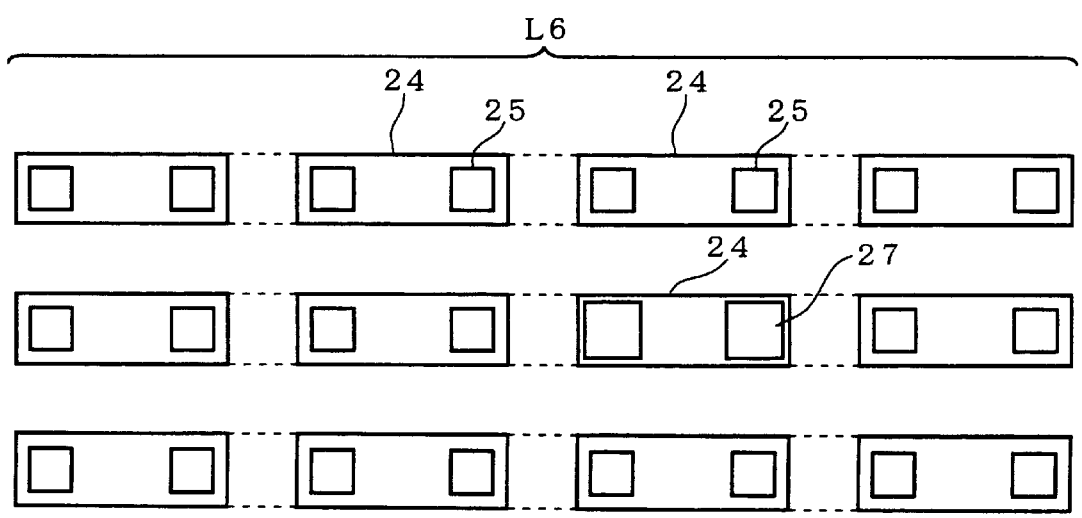
FIG. 16 is a plan view showing part of the semiconductor device of the eleventh preferred embodiment.
Figure 17:
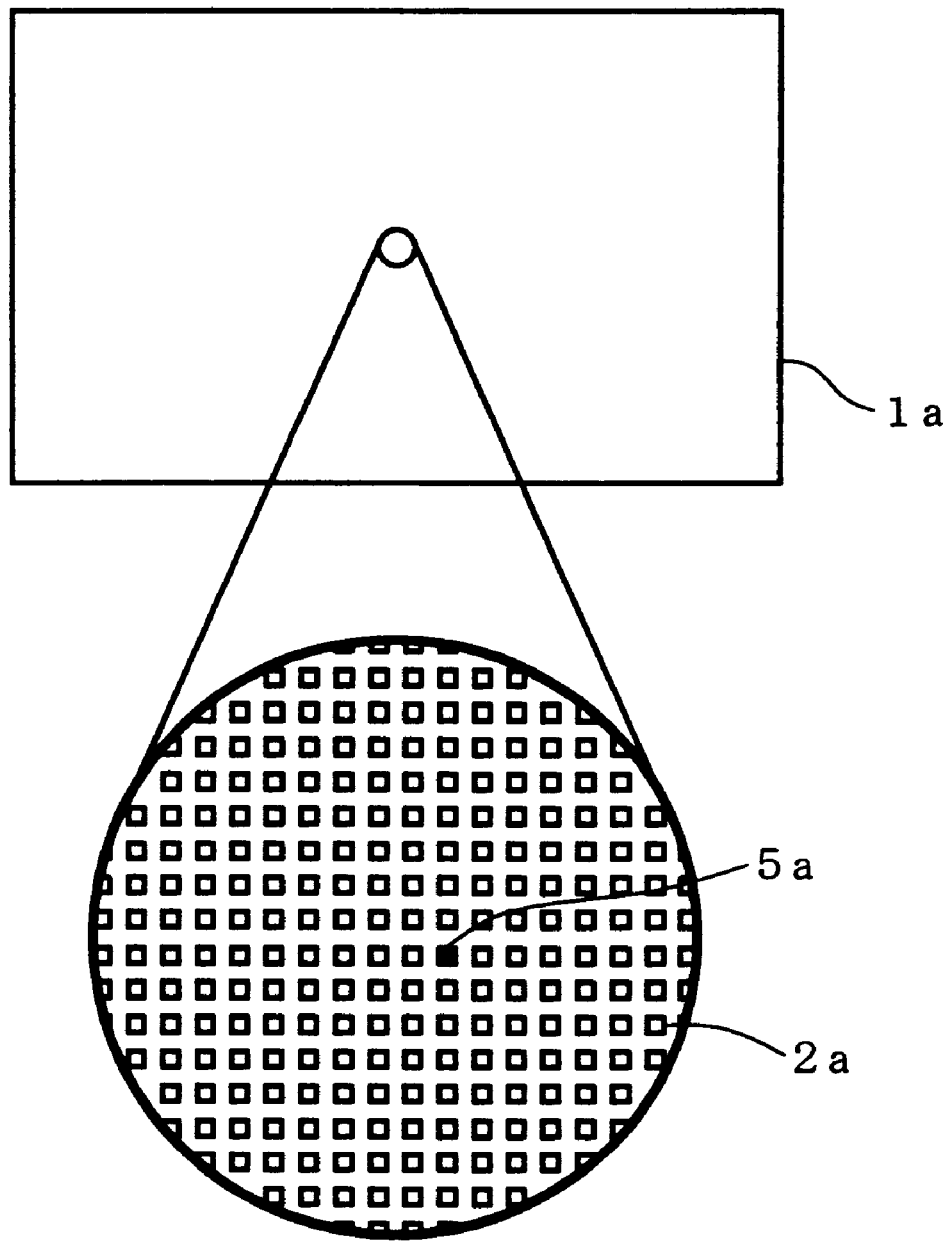
FIGS. 17 and 18 are conceptual renderings of a conventional semiconductor device.
Figure 18:
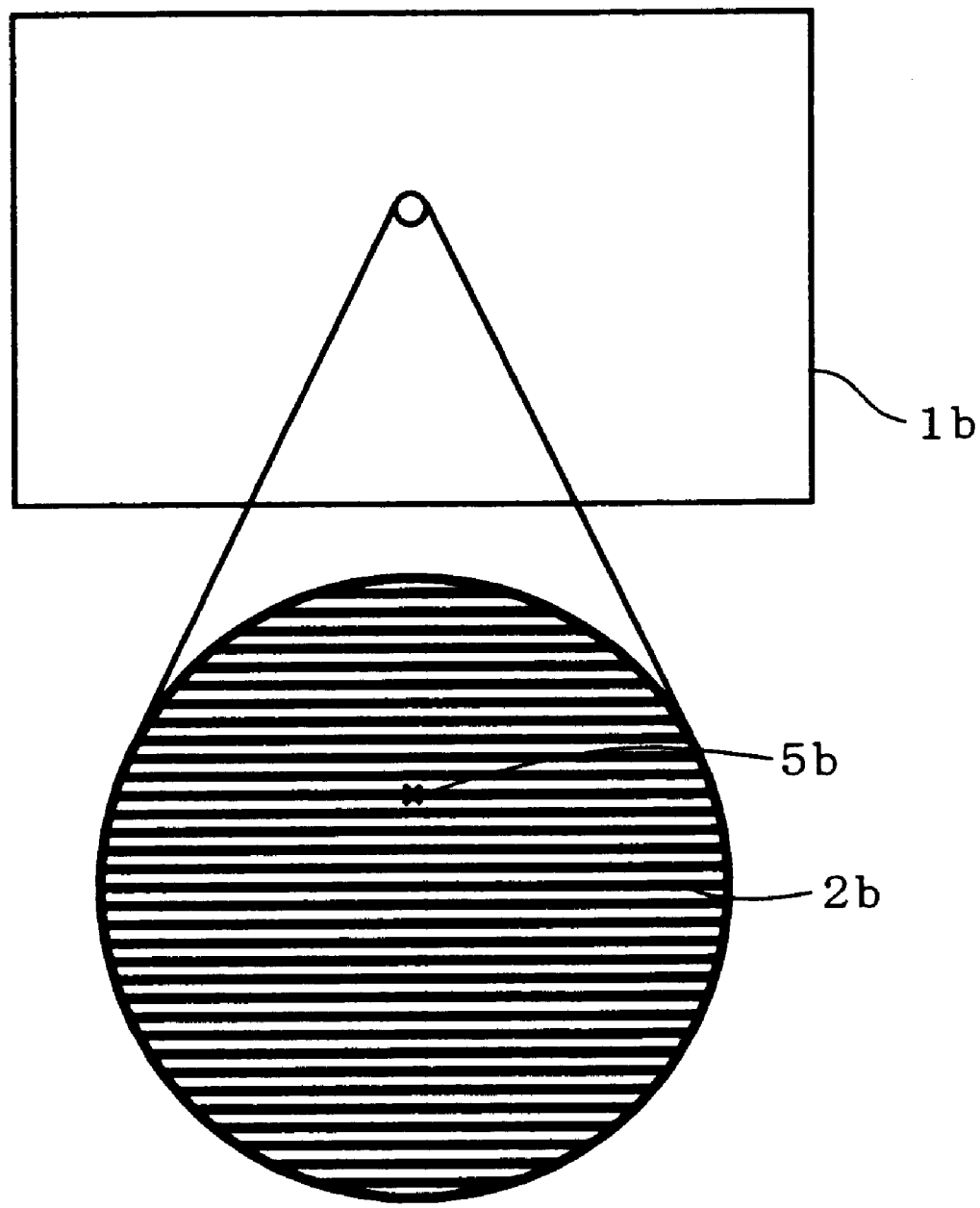

FIG. 16 is a plan view showing part of the semiconductor device according to the eleventh preferred embodiment, e.g., the TEG region 22 of FIG. 11 enlarged. The TEG of the eleventh preferred embodiment is designed to evaluate short or open of the wiring, especially to evaluate via holes.

On the TEG region 22, as in the tenth preferred embodiment, wires L6 to be evaluated are formed in parallel with each other. The wires L6 have multilayer interconnection configuration. In FIG. 16, the upper wiring patterns 24 are indicated by the solid line; the lower wires by the broken line. The upper wiring patterns 24 and the lower wires are electrically connected through the via holes 25. That is, the wiring patterns 24 and the via holes 25 are identical in appearance. Each wire L6 is connected at its one end to the pad P3 and at its other end to the pad P4.

The via holes 25 of wiring patterns 24 which are selected by a predetermined rule are altered in shape to obtain via holes 27. Here the predetermined rule is for example to select one for every 10 wiring patterns 24 to alter the shape of the via holes 25.

The via hole (member) 27 has the same function of electrically connecting the upper and lower wires as the via hole (member) 25. In FIG. 16, the via hole 27 is larger in size than the via hole 25, but it may be smaller than the via hole 25.

With the via holes 27, the position of a defect is readily detectable as in the first preferred embodiment.

12. Modification

Alternatively, the mark patterns 4 of FIG. 1 may be substituted by the mark lines (FIG. 10). In this case, the mark lines are provided above the element isolation region 8 of FIG. 3.

While the invention has been described in detail, the foregoing description is in all aspects illustrative and not restrictive. It is understood that numerous other modifications and variations can be devised without departing from the scope of the invention.

What is claimed is:

1. A semiconductor device comprising:

a semiconductor substrate; and a plurality of patterns identical in appearance on said semiconductor substrate, wherein in a region composed of said plurality of patterns, portions that are selected by a predetermined rule are provided with mark patterns and remaining portions do not have mark patterns, wherein said plurality of patterns are elements each converting light into an electric signal;

said portions selected by said predetermined rule include said elements; and said elements in said portions selected by said predetermined rule are completely surrounded by said mark patterns.

* * * * *